United States Patent [19]

Sato

[11] Patent Number: 5,508,208
[45] Date of Patent: Apr. 16, 1996

[54] METHOD OF MANUFACTURING DIAMOND SEMICONDUCTOR

[75] Inventor: Junichi Sato, Tokyo, Japan

[73] Assignee: Sony Corporation, Tokyo, Japan

[21] Appl. No.: 313,370

[22] Filed: Sep. 27, 1994

[30] Foreign Application Priority Data

Sep. 30, 1993 [JP] Japan .................... 5-268391

[51] Int. Cl.$^6$ ................................ H01L 21/268
[52] U.S. Cl. ............................. 437/18; 117/929
[58] Field of Search ................. 437/18; 117/929

[56] References Cited

U.S. PATENT DOCUMENTS

| | | | |
|---|---|---|---|
| 4,571,447 | 2/1986 | Prins | 136/252 |
| 4,778,561 | 10/1988 | Ghanbari | 156/643 |
| 5,001,452 | 3/1991 | Imai et al. . | |
| 5,099,296 | 3/1992 | Mort et al. . | |
| 5,250,149 | 10/1993 | Kimoto et al. . | |
| 5,306,529 | 4/1994 | Nishimura | 427/526 |

FOREIGN PATENT DOCUMENTS

| | | |
|---|---|---|
| 0543392 | 5/1993 | European Pat. Off. . |
| 3-205398 | 9/1991 | Japan . |
| 4-175295 | 6/1992 | Japan . |
| 4-266020 | 9/1992 | Japan . |

OTHER PUBLICATIONS

Patent Abstracts of Japan, vol. 16, No. 482, Oct. 7, 1992 & JP–A–60 04 174 517.

*Primary Examiner*—R. Bruce Breneman
*Assistant Examiner*—Linda J. Fleck
*Attorney, Agent, or Firm*—Hill, Steadman & Simpson

[57] ABSTRACT

In a method of manufacturing diamond semiconductor mainly composed of carbon, a technique is provided which is free from the possibility of destruction of diamond structure, permits n-type doping into diamond and further permits high concentration n-type doping. In this method of diamond semiconductor manufacture, lithium atoms (which may be produced from a nitrogen compound of lithium, for instance lithium azide) is doped using ECR plasma into diamond 102 with the surface thereof having been cleaned, if necessary.

10 Claims, 2 Drawing Sheets

METHOD OF MANUFACTURING DIAMOND SEMICONDUCTOR

BACKGROUND OF THE INVENTION

This invention relates to a method of manufacturing diamond semiconductor and, more particularly, to a method of manufacturing diamond semiconductor with improved diamond semiconductor doping techniques.

There were attempts to artificially synthesize diamond in old days, and in 1960s it became possible to successfully syntheize diamond even under low pressures. Up to date, it has become possible to manufacture thin films of diamond under pressure close to vacuum. This has led to extensive attempts to obtain diamond semiconductor from thin film diamond and produce semiconductor devices by using such diamond semiconductor.

Compared to silicon, diamond has the following characteristics.

(1) Its carrier mobility is so higher that its operation speed is several times that in case of silicon.

(2) Its band gap is as wide as 5.5 eV, and thus it is capable of operation without destruction at an overwhelmingly high temperature of 700° C. compared to silicon. (With silicon, a trend of operation state deterioration arises at around 150° C.)

(3) It is strong against radiant rays. Particularly, it is less subject to software error due to radiation which is a problem in the super LSI. This means that it can be used even in bad environments. Thus, it is expected to be used in stringent environments such as universal space or places around a nuclear reactor. Such applications can not be expected with silicon.

For practical use of diamond semiconductor, however, there are problems to be solved such as follows.

(1) There still is no process of inexpensively growing single crystal thin film.

(2) It is impossible to obtain n-type doping.

(3) There still is no estabilished etching technique for drawing complicated circuits.

Particularly, the problem in (2), i.e., impossibility of n-type doping, is a fatal one in the device production, which is very serious for the future practical use of diamond semiconductor.

This point will be described in further detail. Diamond itself is generally very inferior in the doping efficiency when it is used as semiconductor material. For example, the carrier concentration that is obtainable by a p-type semiconductor with 1,000 ppm of boron is only about $10^{16}$ cm$^{-3}$.

Further, the constituent element of diamond is carbon, with its atomic diameter being small compared to silicon or the like. Therefore, it is impossible to use for the n-type doping such element as phosphorus which is used in the silicon process, and it is inevitable to use nitrogen with the atomic diameter close to that of carbon (see, for instance, Japanese Patent Laid-Open Publication No. Sho 4-266020). In case of using nitrogen, however, there is the following problem.

The fifth valence electron of the nitrogen atom is strongly bound to the nitrogen atom, and its releasing requires as great electron energy as 1.7 eV. Therefore, at room temperature only a very small number of electrons can be moved in the crystal, and thus effective device functions can not be obtained. For this reason, when using nitrogen atoms as dopant, it is necessary to effect the doping without causing destruction of the crystal structure and also with a high concentration. This dictates some or other contrivance for the doping process. Due to this problem, nitrogen is inconvenient as doping means. Accordingly, there has been a demand for an n-type doping technique using an element other than nitrogen.

As prior art, there has been proposed a technique of forming diamond semiconductor through vapor growth (CVD) using a heated filament process, which uses as material a liquid-phase organic compound containing lithium or a compound thereof (obtainable by dissolving lithium oxide, lithium hydroxide, lithium chloride, lithium ethylate, etc. in acetone, methanol, ethanol, altaldehyde, etc.) (Japanese Patent Laid-Open No. Hei 3-205398). There has also been proposed a technique of forming diamond semiconductor through the heated filament CVD or various types of plasma CVD by adding lithium or a compound thereof to the material gas (such as methane) in a heating device (Japanese Patent Laid-Open Publication No. Hei 4-175295). These techniques, however, are not always clear with respect to their realization. In addition, in either technique impurities are introduced simultaneously with the diamond semiconductor thin film formation, and it is not that the diamond semiconductor having been formed is doped.

SUMMARY OF THE INVENTION

The present invention has been obtained in the light of the problems discussed above, and it seeks to provide a technique, which can solve the above problems, is free from the possibility of diamond structure destruction, permits n-type doping of diamond and permits high concentration n-type doping.

According to the present invention, the above problems are solved by a method of manufacturing diamond semiconductor mainly composed of carbon, in which lithium atoms are doped by using ECR plasma.

Preferably, the lithium atoms are produced from a nitrogen compound of lithium.

The nitrogen compound of lithium may be lithium azide.

In carrying out the invention, a pulse microwave may be supplied for the ECR plasma.

There may be provided a step of dry cleaning the diamond surface prior to the doping.

The step of dry cleaning may be carried out with ECR plasma and by using the same apparatus as for the doping.

The invention is predicated in the following knowledge secured by the inventor. While it is well known in the art that boron is used as p-type dopant for diamond semiconductor, it has been pointed out that boron, when struck by a neutron, becomes lithium of n-type. According to the invention, this problem is used conversely, and lithium is used. Lithium has a smaller atomic radius than carbon atoms, and thus it is suitable as dopant.

The ECR discharge permits formation of high density plasma of about $1 \times 10^{12}$ cm$^{-3}$ by using the commonly termed electronic cyclotron resonance. It is thus possible to produce active lithium atoms at a high density. Besides, the ion energy is too low to be able to destroy the crystal structure.

As for the source of lithium element, almost all lithium compounds are solid at normal temperature. Therefore, compounds which have been provided in the prior art of obtaining diamond semiconductor using lithium or a compound thereof as noted before, are not always convenient, and it is suitable to use a compound which can be readily gassified. An example of such compound may be nitrogen compounds of lithium. Particularly, lithium azide which can be decomposed at about 120° C., can be used suitably as the source for CVD or the like. Further, as a result of decomposition of lithium azide, nitrogen is produced as another element. It is disclosed that nitrogen may be an n-type dopant with respect to diamond (e.g., Japanese Patent Laid-Open Publication No. Hei 4-266020, and U.S. patent application No. 08/238,892 filed on May 6, 1994 assigned to the assignee of the present application), and it is free from pollution problems.

Generally, high ionization degree plasma is obtainable without burden on the side of the plasma generating apparatus by supplying pulse microwave to the apparatus. As an example, in order to obtain a high temperature plasma at an ion density of $1 \times 10^{14}$ cm$^{-3}$ or above, the microwave output should be 10 W/cm$^2$ or above. When such high power microwave is supplied as a continuous wave to the chamber, great damage may be caused to the window member between the chamber and waveguide and also to the chamber inner walls. By supplying pulse microwave, high density plasma is obtainable without such problem. In addition, the gas dissociation proceeds, and active lithium atoms can be produced at a high density.

Further, by using the same ECR plasma CVD apparatus, the diamond semiconductor surface can be cleaned by causing nitrogen system gas flow with RF bias application before causing lithium azide gas flow. Besides, the nitrogen system gas is free from any pollution problem.

As has been shown, according to the invention it is possible to obtain effective n-type doping of diamond semiconductor and high concentration doping of nitrogen into diamond semiconductor.

DESCRIPTION OF THE PREFERRED EMBODIMENTS

EXAMPLES

Examples of the invention will now be described with reference to the drawings. The following examples of course are by no means limitative and may be changed variously without departing from the scope of the invention. For example, changes in the structures and conditions involved are possible.

Example 1

In this example, the invention is carried out for doping lithium by using lithium azide gas and with ECR plasma while applying no RF bias.

Figure 2:
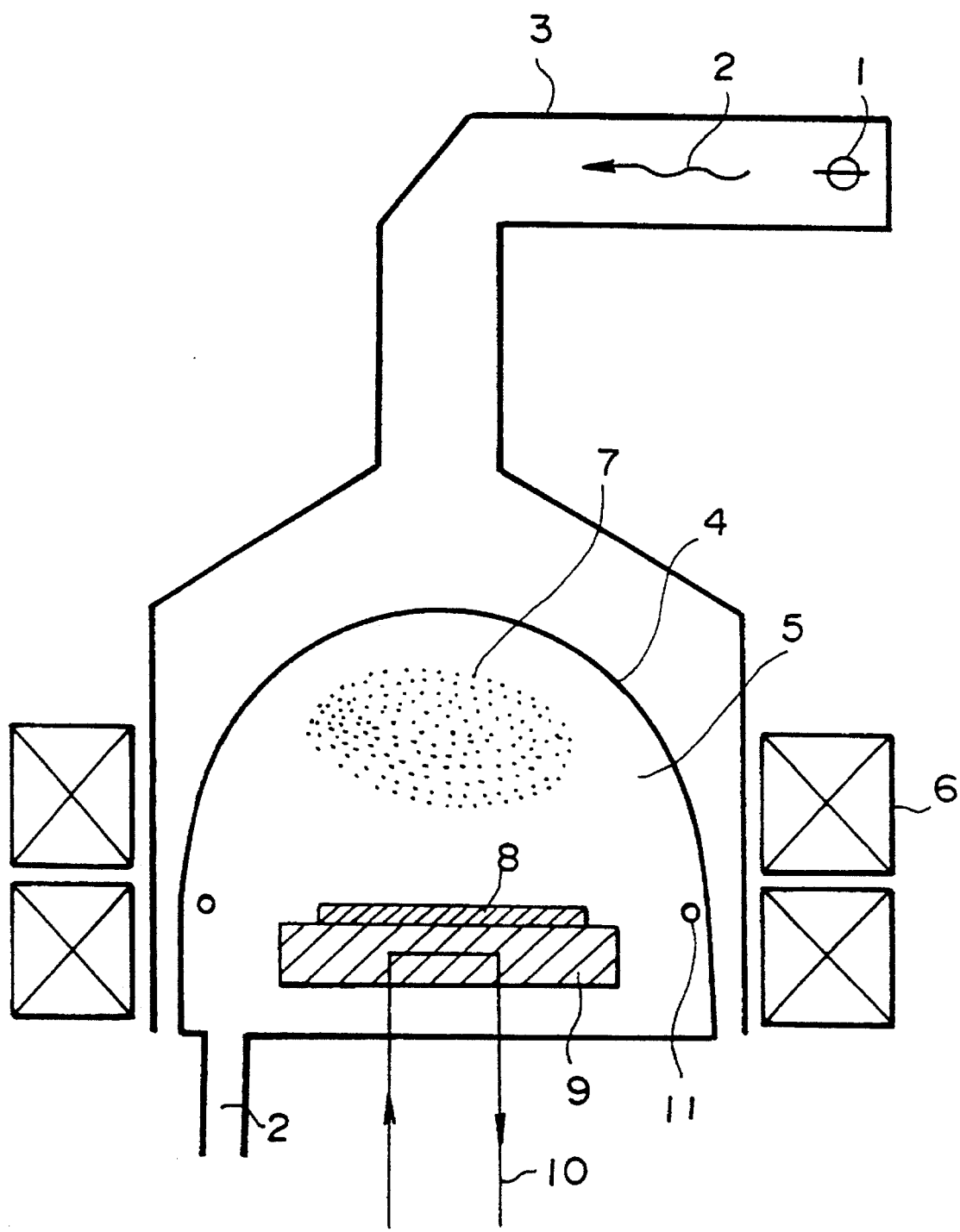
FIG. 2 is an ECR plasma doping apparatus used in the embodiment.

FIG. 2 shows an ECR plasma doping apparatus used in this example. The apparatus is a microwave plasma doping apparatus with magnetic field. A microwave 2 generated in a magnetron 1 is shaped into a pulse wave in a pulse generator, if necessary (in this example it being not shaped into any pulse shape) to be coupled through a waveguide 3 to a reaction chamber 5 defined by quartz wall 4. A solenoid coil 6 which surrounds the reaction chamber 5 generates a microwave frequency (2.45 GHz) and a magnetic field (8.75E-2T) for bringing about commonly termed ECR discharge, thus generating gas plasma 7. A substrate 8 is set on a susceptor 9 which is conveyed and set in position by conveying means (not shown). The susceptor 9 with the substrate 8 set thereon is heated from a heater (not shown) through a heater tubing 10, whereby the substrate 8 is heated. Gas is introduced through a gas inlet tube 11 and exhausted by an exhausting system (not shown) through an exhausting tube. Lithium azide is accommodated in a tank (not shown) capable of heating, and it is heated to 120° C. before it is supplied.

In this example, the doping into diamond semiconductor was carried out as follows.

A diamond semiconductor film 102 was formed by low pressure synthesis on a substrate 101, and then an insulating film (SiO$_2$ film) 103 was formed to a thickness of 200 nm on the film 102 by the usual plasma CVD to form a resist pattern 104. Then, an opening is formed by etching to form an exposed portion 105 (FIG. 1(A)).

Then, doping was made into the exposed portion 105 of the diamond semiconductor film 102 using the apparatus of FIG. 2 described above and under the following conditions, thus forming a diffusion layer 106.

Rate of gas flow: LiN$_3$=30 SCCM

Pressure: 1.33 Pa

Temperature: 150° C.

Microwave: 850 W (2.45 GHz )

RF bias: 0 W

Since microwave was supplied at this time, high density plasma (of about $10^{12}$ cm$^{-3}$) was produced by the ECR discharge to dope lithium atoms at a high density. Thus, the diffusion layer 106 as shown in FIG. 1(B) could be formed efficiently.

The operation of this diamond semiconductor was tested to obtain satisfactory semiconductor operation.

As shown, with this example it is possible to obtain efficient n-type doping into diamond semiconductor, which has been a fatal problem in the prior art, and manufacture high performance diamond semiconductor with high productivity and inexpensively.

Example 2

This example concerns the doping into diamond semiconductor with pulse plasma. The same ECR plasma doping apparatus shown in FIG. 2 as in Example 1 was used.

Figure 1A:
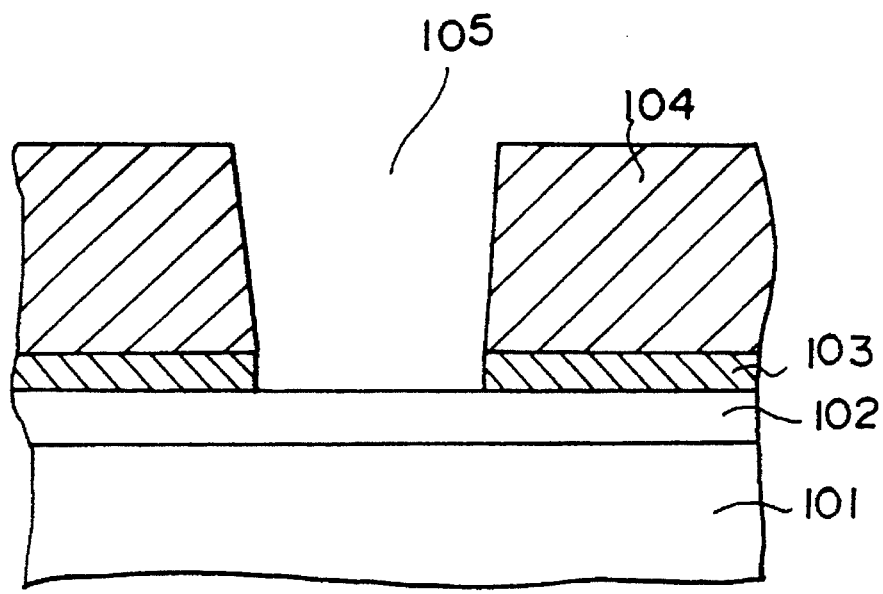
FIGS. 1(A) and 1(B) are views illustrating a process in an embodiment.
Figure 1B:
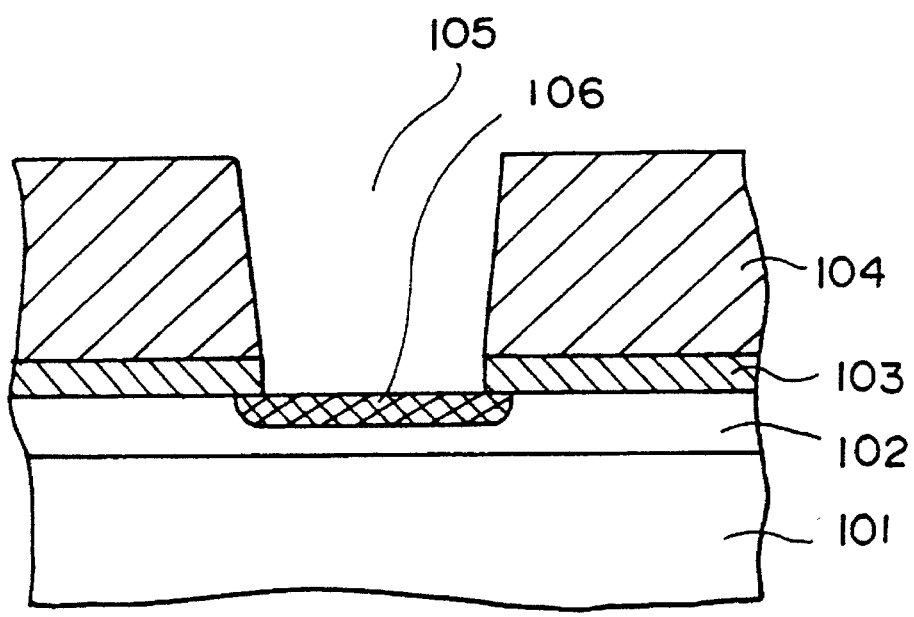

The work had the same structure as that in Example 1, so FIGS. 1(A) and 1(B) will be referred to.

As in Example 1, diamond semiconductor 102 was formed by low pressure synthesis on substrate 101. Then, SiO$_2$ film 103 was formed to a thickness of 200 nm on the film 102 to form resist pattern 104. Then, an opening was formed by etching to form exposed portion 105. The structure shown in FIG. 1(A) was then formed.

Doping was then carried out into the exposed portion 105 of the diamond semiconductor film 102 using the apparatus of FIG. 2 and under the following conditions, thus forming diffusion layer 106.

Rate of gas flow: LiN$_3$=30 SCCM

Pressure: 1.33 Pa

Temperature: 150° C.

Microwave: 850 W (2.45 GHz)

RF bias: 0 W

Pulse ratio: 1:2

Since in this embodiment pulse microwave was supplied at this time, high density (at about $1\times10^{14}$ cm$^{-3}$) plasma was generated to obtain high density doping of lithium atoms, thus obtaining the structure shown in FIG. 1(B). With this example, the same effects as in Example 1 could be obtained.

Example 3

In this example, the doping was carried out in combination with surface cleaning. The same ECR plasma doping apparatus as in Example 1 was used.

Now, an actual example of application of the invention to the doping into diamond semiconductor will be described with reference to FIGS. 1(A) and 1(B).

Diamond semiconductor film 102 was formed by low pressure synthesis on substrate 101, and then SiO$_2$ film 103 was formed to a thickness of 200 nm on the film 102 by usual plasma CVD to form resist pattern 104. An opening was then formed by etching to form exposed portion 105 (FIG. 1(A)).

Then, the surface of the exposed portion 105 in the diamond semiconductor film 102 was cleaned by using the apparatus of FIG. 2 and under the following conditions. At this time, it is usual to effect etching by applying a RF bias, and this principle is utilized in this example. The substrate temperature was set to 30° C. The microwave was held "on" at all times. The N$_2$O gas that is used at this time has no adverse effects on diamond and does not have any possibility of pollution. Of course, it is possible to use other nitrogen system gases such as nitrogen gas. By using the nitrogen system gas in the above way, it is possible to avoid cross contamination (or mutual contamination).

Rate of gas flow: N$_2$O=30 SCCM

Pressure: 1.33 Pa

Temperature: 30° C.

Microwave: 850 W (2.45 GHz)

RF bias: 30 W

Afterwards, further doping into the exposed portion 105 of the diamond semiconductor layer 102 was carried out by using the apparatus 2 and under the following conditions, thus forming diffusion layer 106. The conditions were the same as in Example 2.

Rate of gas flow: LiN$_3$ 30 SCCM

Pressure: 1.33 Pa

Temperature: 100° C.

Microwave: 850 W (2.45 GHz)

RF bias: 0 W

Pulse ratio: 1:2

As shown, since pulse microwave was supplied, high density (of about $1\times10^{14}$ cm$^{-3}$) plasma was generated to obtain high density doping of lithium atoms (FIG. 1(B)).

While in this example, cleaning is carried out in combination with Example 2, it is also effective to carry out cleaning in combination with Example 1.

As has been described in the foregoing, according to the invention it is possible to carry out n-type doping into diamond without having adverse effects on the diamond structure, and high concentration n-type doping is possible.

What is claimed is:

1. A method of making an n-doped diffusion layer in a diamond semiconductor device comprising the steps of:

providing a substrate including a diamond semiconductor film thereon and an etched insulating film on said diamond semiconductor film defining exposed portions; and doping the exposed portions with lithium to form a diffusion layer by placing the substrate in a reaction chamber and exposing the substrate to a high density ECR plasma having a plasma density of $1\times10^{12}$ cm$^{-3}$ or more formed from a gas of nitrogen compound of lithium.

2. The method of manufacturing a diamond semiconductor device according to claim 1, wherein the ECR plasma is produced by pulse microwave.

3. The method of manufacturing a diamond semiconductor device according to claim 1, wherein the surface of the diamond semiconductor layer is dry cleaned before the doping.

4. The method of manufacturing a diamond semiconductor device according to claim 3, wherein the dry cleaning is carried out by using ECR plasma.

5. The method of manufacturing a diamond semiconductor device according to claim 3, wherein the dry cleaning is carried out by using N$_2$O etching gas.

6. The method of manufacturing a diamond semiconductor device according to claim 3, wherein the dry cleaning and the doping are carried out in the same plasma apparatus.

7. The method of manufacturing a diamond semiconductor device according to claim 1, wherein the nitrogen compound of lithium is lithium azide.

8. A method as defined in claim 1, wherein in said doping step, the substrate is exposed to a high density ECR plasma at a pressure of about 1.33 Pa and a temperature of about 100° C. to about 150° C.

9. A method as defined in claim 7, wherein said lithium azide gas is pre-heated to about 120° C. and is introduced to said reaction chamber at a flow rate of about 30 SCCM.

10. A method as defined in claim 1, wherein said high density ECR plasma has a plasma density of $1\times10^{14}$ cm$^{-3}$ and is produced by pulsed microwave at a microwave of about 850 W and a pulse ratio of 1:2.

* * * * *